(12) United States Patent
Shiah

(10) Patent No.: US 12,717,732 B2
(45) Date of Patent: Aug. 25, 2026

(54) MEMORY SYSTEM AND MEMORY CHIP

(71) Applicant: Etron Technology, Inc., Hsinchu (TW)

(72) Inventor: Chun Shiah, Hsinchu City (TW)

(73) Assignee: ETRON TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 16/904,597

(22) Filed: Jun. 18, 2020

(65) Prior Publication Data

US 2021/0103533 A1 Apr. 8, 2021

Related U.S. Application Data

(60) Provisional application No. 62/910,468, filed on Oct. 4, 2019, provisional application No. 63/007,960, filed on Apr. 10, 2020.

(51) Int. Cl.

| | |
|---|---|
| ***G06F 13/16*** | (2006.01) |
| ***G11C 7/06*** | (2006.01) |
| ***G11C 7/10*** | (2006.01) |
| ***G11C 11/4091*** | (2006.01) |
| ***G11C 11/4093*** | (2006.01) |
| ***G11C 11/4096*** | (2006.01) |
| ***H03M 9/00*** | (2006.01) |

(52) U.S. Cl.

CPC ...... *G06F 13/1678* (2013.01); *G11C 11/4091* (2013.01); *G11C 11/4093* (2013.01)

(58) Field of Classification Search

CPC ... G11C 11/4096; G11C 7/106; G11C 7/1012; G11C 7/1087; G11C 11/4093; G11C 11/4091; G11C 7/1066; G11C 7/1093; G11C 2207/107; G11C 2207/108; G06F 13/1678; Y02D 10/00

USPC ........................................................ 710/305

See application file for complete search history.

(56) References Cited

U.S. PATENT DOCUMENTS 6,249,483 B1 * 6/2001 Kim ........................ G11C 7/106 365/230.01
6,278,650 B1 * 8/2001 Kang .................. G11C 11/4096 365/208
2001/0026483 A1 * 10/2001 Hasegawa ............ G11C 29/025 365/200
2004/0027900 A1 2/2004 Lee
2005/0015558 A1 * 1/2005 Evans .................. G11C 7/1009 711/154
2005/0071582 A1 * 3/2005 Sohn .................... G11C 7/1051 711/154
2005/0249003 A1 * 11/2005 Kim ..................... G11C 7/1078 365/205
2005/0285862 A1 12/2005 Noda
2009/0154256 A1 * 6/2009 Kim ......................... G11C 7/22 365/194

(Continued)

FOREIGN PATENT DOCUMENTS

JP 7-334997 12/1995
TW 421741 2/2001

*Primary Examiner* — Chun Kuan Lee

(74) *Attorney, Agent, or Firm* — Birch, Stewart, Kolasch & Birch, LLP

(57) ABSTRACT

A memory chip includes a memory bank, an I/O data bus, and a first plurality of sensing amplifiers. The first plurality of sensing amplifiers is configured to parallelly output a first plurality of data. A width of the I/O data bus is equal to a width of the first plurality of data parallelly outputted by the first plurality of sensing amplifiers.

3 Claims, 9 Drawing Sheets

(56) References Cited

U.S. PATENT DOCUMENTS

2009/0240866 A1* 9/2009 Kajigaya ............. G06F 13/1657 711/149
2011/0182099 A1* 7/2011 Kim ......................... G11C 5/06 365/51
2012/0011424 A1* 1/2012 Schuette ............. G06F 11/1048 714/E11.034
2013/0036337 A1* 2/2013 Venkatasubramanian .................. G01R 31/31858 714/E11.155
2014/0304462 A1* 10/2014 Venugopal .............. G06F 13/16 711/104
2019/0005376 A1* 1/2019 Akin ........................ G06N 3/08

* cited by examiner

MEMORY SYSTEM AND MEMORY CHIP

CROSS REFERENCE TO RELATED APPLICATIONS

This application claims the benefit of U.S. Provisional Application No. 62/910,468, filed on Oct. 4, 2019 and entitled "Novel DRAM System", and the benefit of U.S. Provisional Application No. 63/007,960, filed on Apr. 10, 2020 and entitled "Better dram system," the contents of which are incorporated herein by reference.

BACKGROUND OF THE INVENTION

1. Field of the Invention

The present invention relates to a memory system and a memory chip, and particularly to a memory system and a memory chip that can let data be transmitted between a logic circuit and the memory chip in parallel.

2. Description of the Prior Art

Nowadays, a memory system for high performance computing or artificial intelligence (AI) system usually includes dynamic random access memory (DRAM) chips and a logic circuit. Due to stacked structures of the DRAM chips, scaling of the DRAM chips cannot follow scaling of the logic circuit. Therefore, a memory-wall effect occurs to result in data transmission rates between the logic circuit and the DRAM chips being reduced. To overcome the memory-wall effect, the prior art usually utilizes faster data rate (e.g., from DDR3 to DDR4 or DDR5) to transmit data between the DRAM chips and the logic circuit, or 2) utilizes wide data bus of the logic circuit and wide data bus of the DRAM chips (e.g. HBM) to transmit data between the DRAM chips and the logic circuit. However, the faster data rate has disadvantages (e.g. more expensive tester, less noise margin, and so on), and the wide data bus of the logic circuit and the wide data bus of the DRAM chips also have disadvantages (e.g. higher power, larger die area, and expensive Through-Silicon Via ("TSV") process, and so on). And no matter the aforesaid faster data rate of the DRAM or the wider data bus of the DRAM, all need serial-to-parallel circuit and parallel-to-serial circuit which increases clock latencies and power consumption.

Please refer to FIG. 1. FIG. 1 is a diagram illustrating a memory system 10 according to the prior art. As shown in FIG. 1, the memory system 10 includes a memory 20 and a logic circuit 30, wherein the memory 20 is a dynamic random access memory (DRAM). As shown in FIG. 1, the memory 20 includes cell arrays 21, a parallel-to-serial circuit 22, and a serial-to-parallel circuit 23; the logic circuit 30 includes a physical layer (PHY) 31 and a controller 32, and the physical layer also includes a serial-to-parallel circuit 312, and a parallel-to-serial circuit 314. In addition, of course, the logic circuit 30 further includes other functional circuits (not shown in FIG. 1), wherein the other functional circuits can include central processing units (CPUs), digital signal processors (DSPs), peripheral interfaces, and so on. As shown in FIG. 1, when the logic circuit 30 writes data into the memory 20, the parallel-to-serial circuit 314 can receive the data (e.g. N-bit data) from the controller 32 in parallel, convert the N-bit data into groups of Q-bit data, wherein Q is less than N), and transmit the groups of Q-bit data to the serial-to-parallel circuit 23; the serial-to-parallel circuit 23 can receive the groups of Q-bit data from the parallel-to-serial circuit 314, convert groups of Q-bit data into the N-bit data, and transmit the N-bit data to the cell arrays 21 in parallel. In addition, when the logic circuit 30 reads the data from the memory 20, the parallel-to-serial circuit 22 can receive the data (e.g. the N-bit data) from the cell arrays 21 in parallel, convert the N-bit data into the groups of Q-bit data, and transmit the groups of Q-bit data to the serial-to-parallel circuit 312; the serial-to-parallel circuit 312 can receive the groups of Q-bit data from the parallel-to-serial circuit 22, convert the groups of Q-bit data into the N-bit data, and transmit the N-bit data to the controller 32 in parallel.

Please refer to FIGS. 2A, 2B. FIGS. 2A, 2B are diagrams illustrating timing diagrams corresponding to the logic circuit 30 writing the data into the memory 20. As shown in FIG. 2A, taking the logic circuit 30 writing 8-bit data D0-D7 into the memory 20 as an example, when the logic circuit 30 writes the 8-bit data D0-D7 into the memory 20, registers (not shown in FIG. 1) of the parallel-to-serial circuit 314 may use three signals clk1, clk2, clk3 to transmit the parallel 8-bit data D0-D7 to the serial-to-parallel circuit 23 in serial. For example, when clk1=1, clk2=1, clk3=1, the parallel-to-serial circuit 314 transmits the datum D0 to the serial-to-parallel circuit 23, when clk1=1, clk2=1, clk3=0, the parallel-to-serial circuit 314 transmits the datum D1 to the serial-to-parallel circuit 23 . . . , and so on. Therefore, the parallel-to-serial circuit 314 starts to transmit the datum D0 at a time T0, and finally transmit the datum D7 at a time T4.

As shown in FIG. 2B, similarly, registers (not shown in FIG. 1) of the serial-to-parallel circuit 23 may also use similar clock signals clk1, clk2, clk3 to process 8-bit data D0-D7 in serial from the parallel-to-serial circuit 314. As shown in FIG. 2B, when clk1=1, clk2=1, clk3=1, the serial-to-parallel circuit 23 receives the datum D0 from the parallel-to-serial circuit 314, when clk1=1, clk2=1, clk3=0, the serial-to-parallel circuit 23 receives the datum D1 from the parallel-to-serial circuit 314 . . . , and so on). Therefore, the serial-to-parallel circuit 23 starts to receive the datum D0 at a time T0, and finally receives the datum D7 at a time T4, wherein 4 clock latencies of the clock clk3 exist between the time T0 and the time T4. That is, the serial-to-parallel circuit 23 only starts to transmit the 8-bit data D0-D7 to the cell arrays 21 in parallel after the serial-to-parallel circuit 23 waits for the 4 clock latencies.

Although the prior art can reduce the 4 clock latencies (e.g. 3.5 clock latencies) by optimizing the memory system 10, the above-mentioned serial-to-parallel converting process executed by the serial-to-parallel circuit 23 and the above-mentioned parallel-to-serial converting process executed by the parallel-to-serial circuit 314 would cost extra power, transmission latencies, and die areas, result in low efficiencies of the memory system 10. Therefore, how to reduce cost of the power, transmission latencies, and die areas becomes an important issue for a designer of the memory system.

SUMMARY OF THE INVENTION

An embodiment of the present invention provides a memory chip which could be a DRAM chip, SRAM chip, or other types memory chips. The memory chip includes a memory bank, an I/O data bus, and a first plurality of sensing amplifiers. The first plurality of sensing amplifiers are configured to parallelly output a first plurality of data. A width of the I/O data bus is equal to a width of the first plurality of data parallelly outputted by the first plurality of sensing amplifiers. There is no serial-to-parallel/serial-to-parallel converting circuit between the first plurality of sensing amplifiers and the I/O data bus.

According to another aspect of the invention, the memory chip further includes a plurality of transceivers between the first plurality of sensing amplifiers and the I/O data bus, wherein the plurality of transceivers parallelly receive and transmit the first plurality of data from the first plurality of sensing amplifiers to the I/O data bus, or parallelly receive and transmit the first plurality of data from the I/O data bus to the first plurality of sensing amplifiers According to another aspect of the invention, the memory chip further includes a second plurality of sensing amplifiers between the memory bank and the first plurality of sensing amplifiers, wherein the second plurality of sensing amplifiers include M sensing amplifiers and are connected to bit lines of the memory chip, the first plurality of sensing amplifiers include N sensing amplifiers and are connected to data lines of the memory chip, both N and M are positive integers, and M is not less than N.

According to another aspect of the invention, the first plurality of sensing amplifiers parallelly output the first plurality of data to the plurality of transceivers or to the second plurality of sensing amplifiers.

According to another aspect of the invention, a portion of the second plurality of sensing amplifiers are selectively coupled to the first plurality of sensing amplifiers, and the portion of the second plurality of sensing amplifiers parallelly output the first plurality of data to the first plurality of sensing amplifiers or to the memory bank; wherein a number of sensing amplifiers in the portion of the second plurality of sensing amplifiers is equal to N.

According to another aspect of the invention, the portion of the second plurality of sensing amplifiers are selectively coupled to the first plurality of sensing amplifiers according to a control signal inputted to the memory chip.

According to another aspect of the invention, the control signal includes a plurality of signal bits which are configured to be stored in a register of the memory chip.

According to another aspect of the invention, the memory chip further includes a plurality of bit switches between the first plurality of sensing amplifiers and the second plurality of sensing amplifiers, wherein the plurality of bit switches electrically connect the portion of the second plurality of sensing amplifiers and the first plurality of sensing amplifiers according to the control signal.

Another embodiment of the present invention provides a memory chip. The memory chip includes a plurality of memory banks, data lines, a plurality set of sensing amplifiers, and an I/O data bus. The plurality set of sensing amplifiers are coupled to the data lines, wherein each set of sensing amplifiers is corresponding to one of the plurality of memory banks and is configured to parallelly output a plurality of data. A width of the I/O data bus is equal to a sum of a width of the plurality of data from each set of sensing amplifiers.

According to another aspect of the invention, the plurality of memory banks include a first memory bank and a second memory bank; the plurality set of sensing amplifiers include a first set of sensing amplifiers coupled to the data lines and a second set of sensing amplifiers coupled to the data lines; the first set of sensing amplifiers are corresponding to the first memory bank and configured to parallelly output a first plurality of data, and the second set of sensing amplifiers are corresponding to the second memory bank and configured to parallelly output a second plurality of data; and the width of the I/O data bus is equal to the sum of the width of the first plurality of data and the width of the second plurality of data.

According to another aspect of the invention, the width of the I/O data bus is N bits, the width of the first plurality of data is N/2 bits and the width of the second plurality of data is N/2 bits.

According to another aspect of the invention, the memory chip further includes bit lines, a third set of sensing amplifiers, and a fourth set of sensing amplifiers. The third set of sensing amplifiers are coupled to the bit lines and configured between the first memory bank and the first set of sensing amplifiers. The fourth set of sensing amplifiers are coupled to the bit lines and configured between the second memory bank and the second set of sensing amplifiers. A portion of the third set of sensing amplifiers are selectively coupled to the first set of sensing amplifiers, and a number of sensing amplifiers in the portion of the third set of sensing amplifiers is equal to a number of sensing amplifiers in the first set of sensing amplifiers. A portion of the fourth set of sensing amplifiers are selectively coupled to the second set of sensing amplifiers, and a number of sensing amplifiers in the portion of the fourth set of sensing amplifiers is equal to a number of sensing amplifiers in the second set of sensing amplifiers.

According to another aspect of the invention, the portion of the third set of sensing amplifiers are selectively coupled to the first set of sensing amplifiers according to a control signal inputted to the memory chip, and the portion of the fourth set of sensing amplifiers are selectively coupled to the second set of sensing amplifiers according to the control signal.

Another embodiment of the present invention provides a memory chip, wherein the memory chip is configured for a computing system with a system bus interface, the system bus interface includes a read data bus and a write data bus. The memory chip includes a memory bank and an I/O data bus. The I/O data bus is configured to parallelly transmit a plurality of data, wherein a width of the I/O data bus is equal to a width of read data bus, and a width of the I/O data bus is equal to a width of write data bus.

According to another aspect of the invention, the memory chip further includes a plurality of transceivers. The plurality of transceivers are between the memory bank and the I/O data bus, the plurality of transceivers receive and transmit the plurality of data from the I/O data bus to the memory bank, or receive and transmit the plurality of data from the memory bank to the I/O data bus.

Another embodiment of the present invention provides a memory controller for a system which includes a system bus interface and a memory chip, wherein the system bus interface includes a read data bus and a write data bus, and the memory chip includes an I/O data bus. The memory controller includes a control circuit and a physical layer circuit. The control circuit is configured to couple to the system bus interface. The physical layer circuit is coupled to control circuit and configured to parallelly receive a first plurality of data from the I/O data bus of the memory chip. A width of the first plurality of data is equal to a width of read data bus.

According to another aspect of the invention, the physical layer circuit is further configured to parallelly output a second plurality of data to the I/O data bus of the memory chip; wherein a width of the second plurality of data is equal to a width of the write data bus.

According to another aspect of the invention, the physical layer circuit includes a plurality of transceivers configured to transmit the first plurality of data to the control circuit, and configured to transmit the second plurality of data to the memory chip.

According to another aspect of the invention, the control circuit is electrically connected to the physical layer circuit through a DFI bus.

According to another aspect of the invention, a width of the DFI bus is selectively adjusted according to a control signal inputted to the physical layer circuit.

Another embodiment of the present invention provides a memory system. The memory system includes a system bus interface, a memory controller, and a memory chip. The memory controller is coupled to the system bus interface. The memory chip has an I/O data bus and is coupled to the memory controller. The system bus interface includes a read data bus and a write data bus, and a width of the I/O data bus is equal to a width of the read data bus, and the width of the I/O data bus is equal to a width of the write data bus.

According to another aspect of the invention, the memory controller includes a control circuit coupled to the system bus interface and a physical layer circuit coupled to the control circuit and the I/O data bus; wherein the physical layer circuit is configured to parallelly receive a first plurality of data from the I/O data bus of the memory chip, and is configured to parallelly receive a second plurality of data from the control circuit.

According to another aspect of the invention, the physical layer circuit includes a plurality of transceivers configured to transmit the first plurality of data to the control circuit, and configured to transmit the second plurality of data to the memory chip.

According to another aspect of the invention, the widths of read data bus and write data bus are selectively adjusted according to a control signal inputted to the control circuit.

According to another aspect of the invention, the control circuit is electrically connected to the physical layer circuit through a DFI bus, and a width of the DFI bus is selectively adjusted according a control signal inputted to the physical layer circuit.

The present invention provides a memory system. The memory system includes a memory and a logic circuit. The memory includes a plurality of first pads and a first align circuit for simultaneously transmitting data in parallel or simultaneously receiving the data in parallel. The logic circuit includes a controller and a physical layer, wherein the physical layer includes a plurality of second pads and a second align circuit also for simultaneously transmitting data in parallel or simultaneously receiving the data in parallel, a number of the plurality of first pads equals the plurality of second pads, and the number of the plurality of first pads equals a bit number of the data. The logic circuit utilizes the first align circuit, the plurality of first pads, the plurality of second pads, and the second align circuit to access the data corresponding to the memory in parallel. No more conventional parallel-to-serial and serial-to-parallel circuits is required in both DRAM and PHY. Therefore, compared to the prior art, powers, accessing latencies, and area costs of the memory system can be reduced, and the reading/writing window margins of the memory system can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
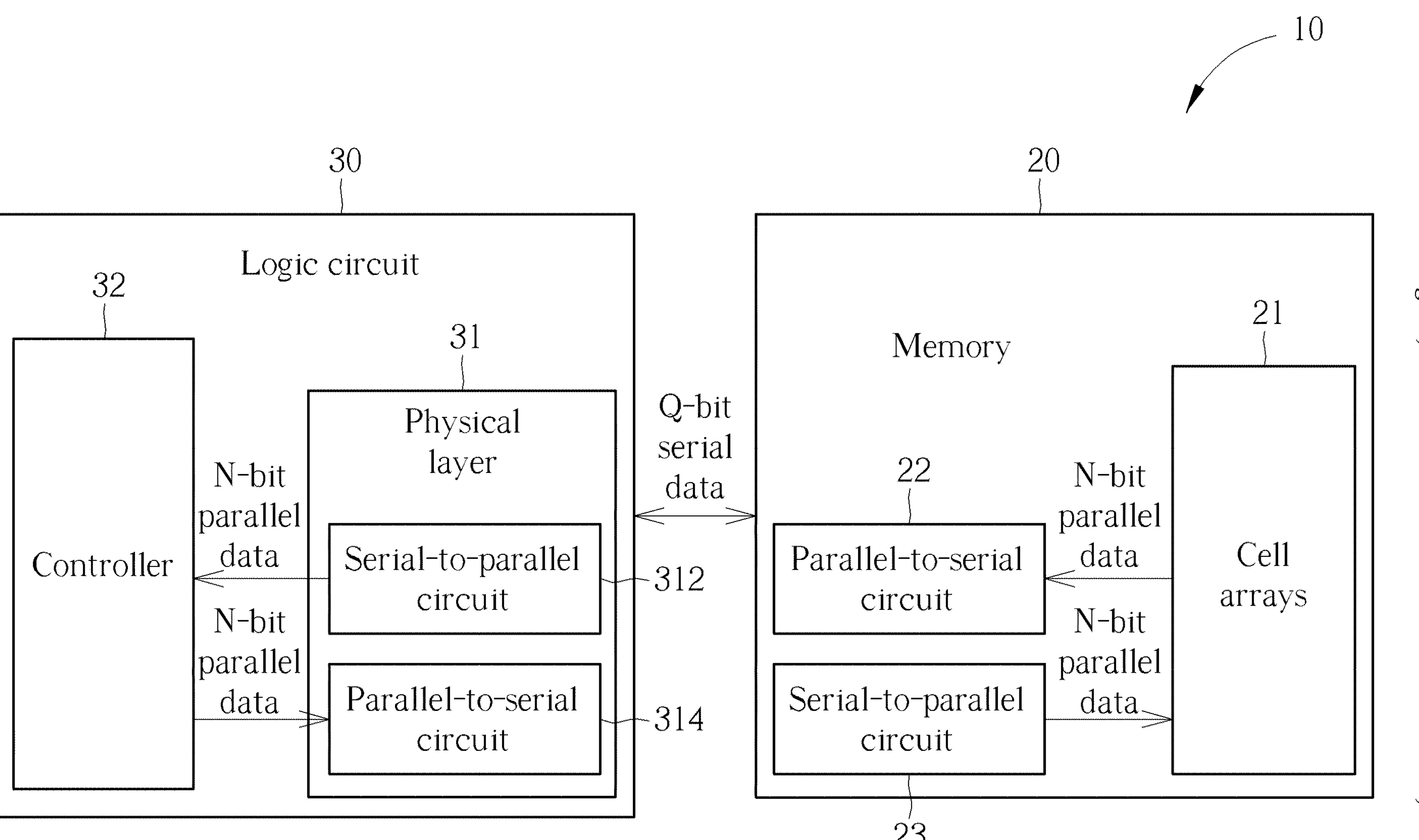
FIG. 1 is a diagram illustrating a memory system according to the prior art.
Figure 2A:
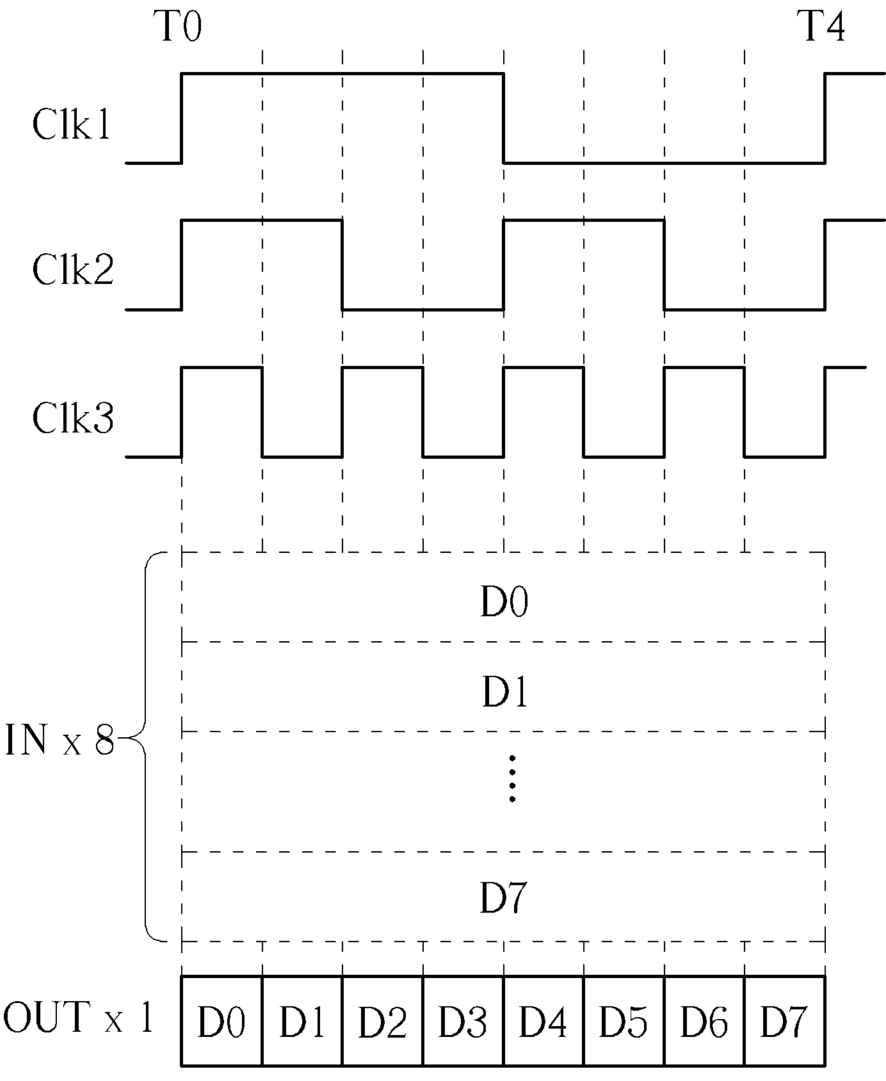
FIGS. 2A, 2B are timing diagrams corresponding to the logic circuit writing the data into the memory.
Figure 2B:
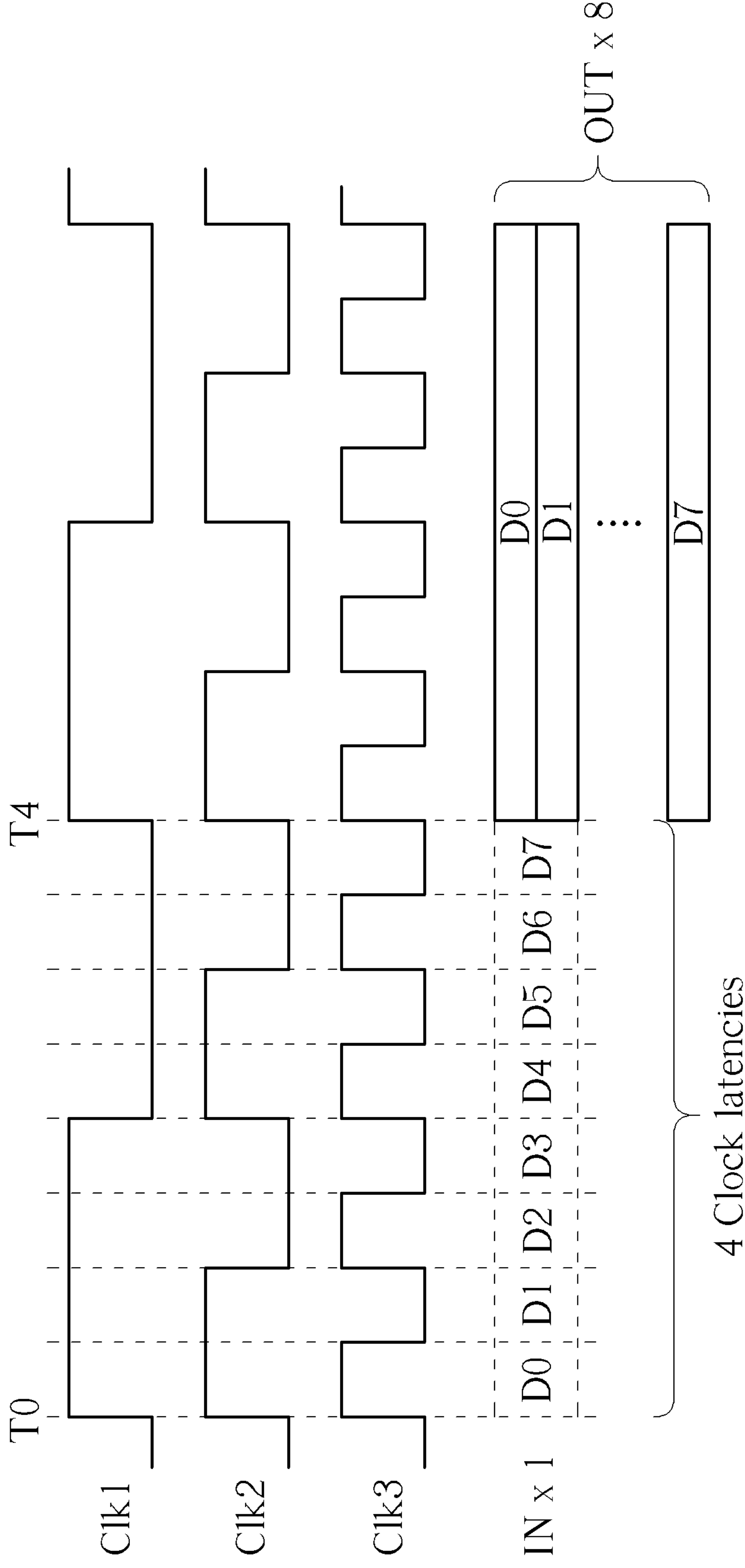
Figure 3:
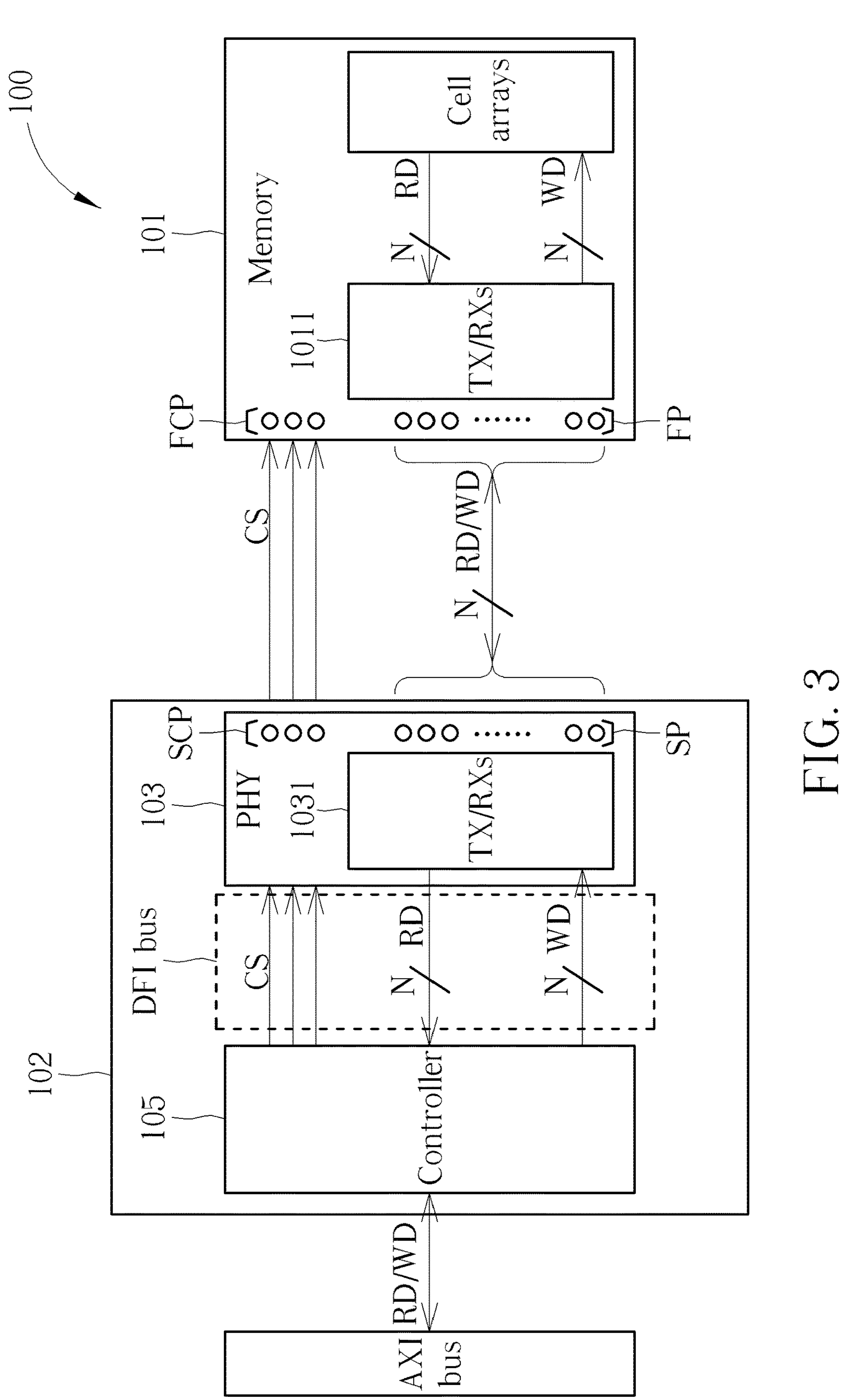
FIG. 3 is a diagram illustrating a memory system according to a first embodiment of the present invention.

Please refer to FIG. 3. FIG. 3 is a diagram illustrating a memory system 100 according to a first embodiment of the present invention. As shown in FIG. 3, the memory system 100 includes a memory 101 and a logic circuit 102, wherein the memory 101 can be a dynamic random access memory (DRAM), a static random access memory (SRAM), a flash memory or other kinds of memories, and the logic circuit 102 can be an artificial intelligence (AI) chip or a system on chip (SOC). In addition, in one embodiment of the present invention, the memory 101 can include a base DRAM chip and a plurality of DRAM chips stacked above the base DRAM chip. In addition, the logic circuit 102 is coupled to other devices or processors through an AXI (Advanced extensible Interface) bus, wherein the AXI bus is a bus protocol, the protocol is part of the AMBA (Advanced Microcontroller Bus Architecture) 3.0 protocol. The AXI bus includes a writing data bus and a reading data bus. In addition, an operation method corresponding to the AXI bus is well-known to those of ordinary skill in the art, so further description thereof is omitted for simplicity.

The memory 101 includes a first align circuit 1011 and a plurality of first pads FP, wherein the first align circuit 1011 is used for aligning data corresponding to the memory 101, and includes a plurality of transceivers. That is, the first align circuit 1011 is used for simultaneously transmitting the data or simultaneously receiving the data (e.g. transmitting the data in a same clock or receiving the data in a same clock, that is, the plurality of transceivers of the first align circuit 1011 can transmit the data in parallel or receive the data in parallel). On the other hand, the logic circuit 102 includes a physical layer (PHY) 103 and a controller 105, wherein the physical layer 103 is electrically connected to the controller 105 through a Double Data Rate Physical Layer Interface (DDR PHY Interface, DFI) bus. The DFI bus includes a plurality of wire pairs, wherein the plurality of wire pairs include a plurality of writing wires and a plurality of reading wires. In addition, the physical layer 103 includes a second align circuit 1031 and a plurality of second pads SP, wherein the second align circuit 1031 is used for aligning the data, and also includes a plurality of transceivers. That is, the second align circuit 1031 is also used for simultaneously transmitting the data or simultaneously receiving the data (e.g. transmitting the data in a same clock or receiving the data in a same clock, that is, the plurality of transceivers of the second align circuit 1031 can transmit the data in parallel or receive the data in parallel).

In this embodiment of present invention, the first align circuit 1011 and the second align circuit 1031 can align and transmit the data in parallel, or can align and receive the data in parallel, and the data can be transmitted between the memory 101 and the logic circuit 102 without the conventional parallel-to-serial and serial-to-parallel circuits in both memory 101 and the physical layer 103. Therefore, the controller (or memory controller) 105 can utilize the plurality of wire pairs, the second align circuit 1031, the plurality of second pads SP, the plurality of first pads FP, and the first align circuit 1011 to access the data corresponding to the memory 101 in parallel. The number of the plurality of first pads FP can equal to a number of the plurality of writing wires (or a number of the plurality of reading wires) of the plurality of wire pairs of the DFI bus. Moreover, the number of the plurality of second pads SP can equal to a number of the plurality of writing wires (or a number of the plurality of reading wires) of the plurality of wire pairs of the DFI bus.

For example, as shown in FIG. 3, the number of the plurality of first pads FP or the number of the plurality of second pads SP equals N, and the data can be N-bit data RD read from cell arrays of the memory 101 or N-bit data WD written into the cell arrays of the memory 101. When the logic circuit 102 reads the N-bit data RD from the cell arrays of the memory 101 in parallel, the first align circuit 1011 receives the N-bit data RD from the cell arrays of the memory 101 in parallel and simultaneously transmits the N-bit data RD in parallel to the second align circuit 1031 through the plurality of first pads FP and the plurality of second pads SP. After the second align circuit 1031 receives the N-bit data RD in parallel, the second align circuit 1031 transmits the N-bit data RD to the controller 105 in parallel through the plurality of reading wires of the plurality of wire pairs of the DFI bus. On the other hand, when the logic circuit 102 writes the N-bit data WD into the cell arrays of the memory 101 in parallel, the second align circuit 1031 receives the N-bit data WD from the controller 105 in parallel through the plurality of writing wires of the plurality of wire pairs of the DFI bus. Then, the second align circuit 1031 simultaneously can transmit the N-bit data WD to the first align circuit 1011 in parallel not through conventional parallel-to-serial and serial-to-parallel circuits. After the first align circuit 1011 receives the N-bit data WD, the first align circuit 1011 writes the N-bit data WD into the cell arrays of the memory 101 in parallel.

Figure 4:
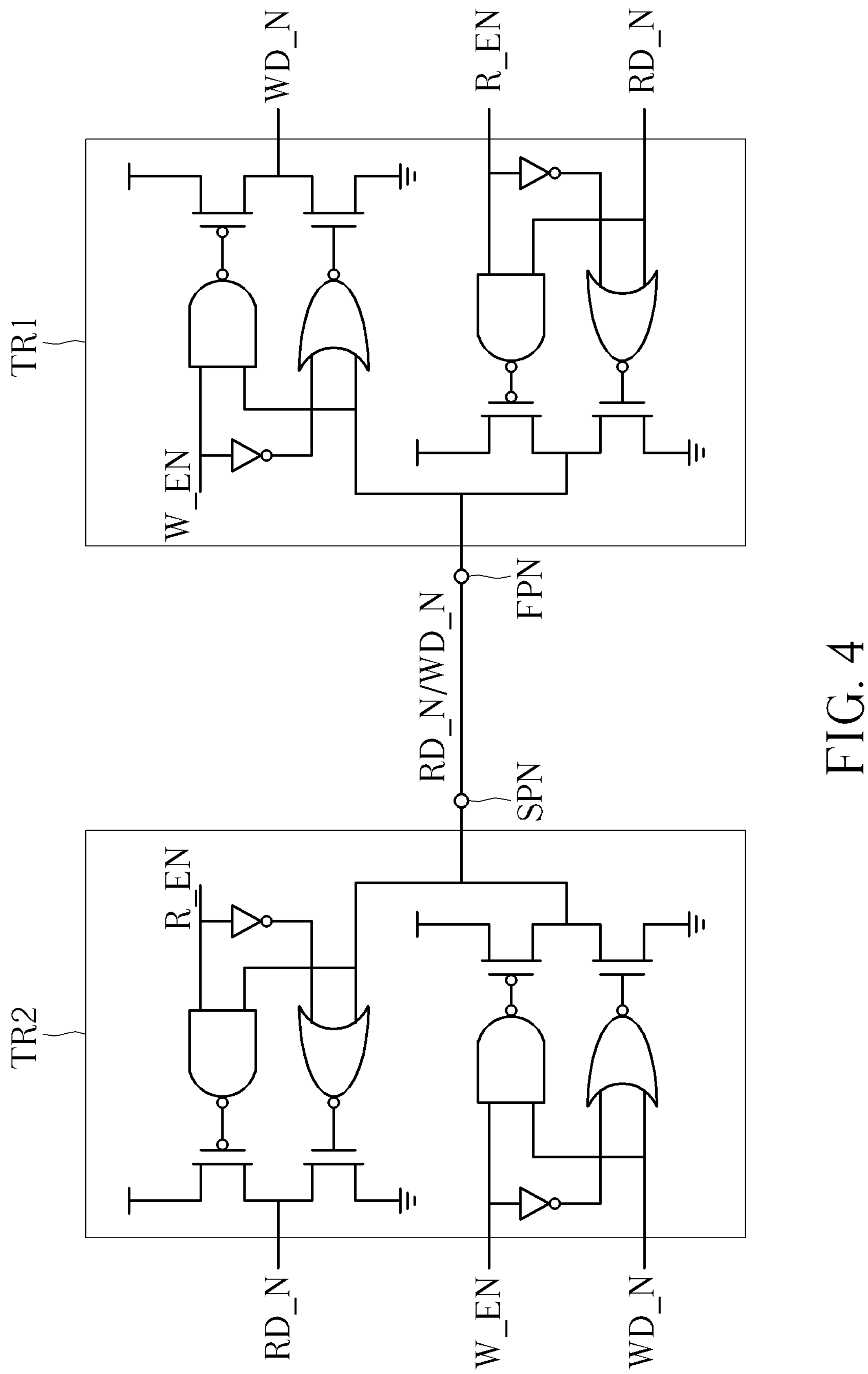
FIG. 4 is a diagram illustrating structures of two transceivers according to another embodiment of the present invention.

In addition, each of the first align circuit 1011 and the second align circuit 1031 comprises a plurality of transceivers, wherein each transceiver of the first align circuit 1011 is coupled to a corresponding pad of the plurality of first pads FP and each transceiver of the second align circuit 1031 is coupled to a corresponding pad of the plurality of second pads SP. Please refer to FIG. 4. FIG. 4 is a diagram illustrating structures of two transceivers TR1, TR2 according to another embodiment of the present invention, wherein each transceiver of the first align circuit 1011 (not shown in FIG. 4) can be the transceiver TR1, and each transceiver of the second align circuit 1031 (not shown in FIG. 4) can be the transceiver TR2. In addition, components of the transceivers TR1, TR2 are well-known to one of ordinary skill in the art, so further descriptions thereof are omitted for simplicity. In addition, coupling relationships between the components of the transceivers TR1, TR2 can be referred to FIG. 4, so further descriptions thereof are also omitted for simplicity. When a write enable signal W_EN is enabled and a read enable signal R_EN is disabled, the transceiver TR2 transmits a bit datum WD N of the N-bit data WD to the transceiver TR1 through a first pad FPN and a second pad SPN. On the other hand, when the write enable signal W_EN is disabled and the read enable signal R_EN is enabled, the transceiver TR1 transmits a bit datum RD_N of the N-bit data RD to the transceiver TR2 through the first pad FPN and the second pad SPN. Because the write enable signal W_EN and the read enable signal R_EN are common signals for the first align circuit 1011 and the second align circuit 1031, the first align circuit 1011 can simultaneously transmit the N-bit data RD in parallel or receive the N-bit data WD in parallel, and the second align circuit 1031 can simultaneously transmit the N-bit data WD in parallel or receive the N-bit data RD in parallel.

In another embodiment of the present invention, a first write enable signal and a first read enable signal are signals for the first align circuit 1011, and a second write enable signal and a second read enable signal are signals for the second align circuit 1031, wherein the first write enable signal and the first read enable signal correspond to the second write enable signal and the second read enable signal, respectively.

Because the first align circuit 1011 and the second align circuit 1031 can transmit data in parallel or receive data in parallel not through conventional parallel-to-serial and serial-to-parallel circuits, the first align circuit 1011 can simultaneously transmit the N-bit data RD to the second align circuit 1031 in parallel or receive the N-bit data WD from the second align circuit 1031 in parallel, and similarly, the second align circuit 1031 can simultaneously receive the N-bit data RD from the first align circuit 1011 in parallel or transmit the N-bit data WD to the first align circuit 1011 in parallel. In addition, as shown in FIG. 4, the present invention is not limited to each transceiver of the first align circuit 1011 being the transceiver TR1 and each transceiver of the second align circuit 1031 being the transceiver TR2. That is, each transceiver of the first align circuit 1011 and each transceiver of the second align circuit 1031 can be other transmitting/receiving circuits, buffers or registers.

Figure 5:
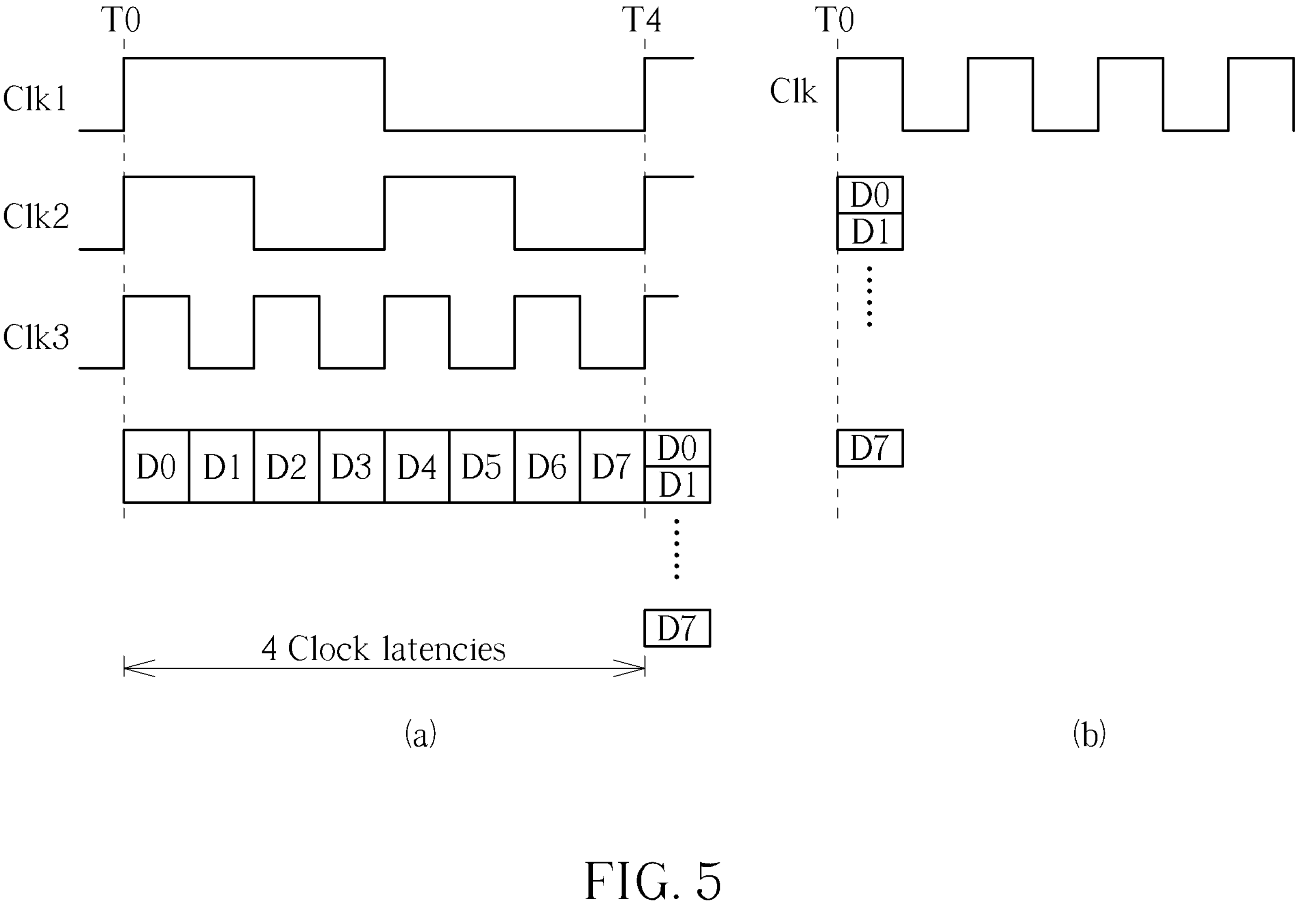
FIG. 5 is a timing diagram comparing a conventional memory system with the memory system.

Please refer to FIG. 5. FIG. 5 is a timing diagram for comparing a conventional memory system with the memory system 100. For example, as shown in FIG. 5(*a*), when a conventional logic circuit reads 8-bit data D0-D7 from a conventional memory, the conventional memory needs to utilize three clocks clk1, clk2, clk3 to form 8 statuses, such that the 8-bit data D0-D7 can be transmitted in serial (for example, datum D0 corresponds to status (clk1=1, clk2=1, clk3=1), datum D1 corresponds to status (clk1=1, clk2=1, clk3=0) . . . and soon). Therefore, a controller of the conventional logic circuit can only start to receive the data D0-D7 until a time T4 in parallel. However, as shown in FIG. 5(*b*), because the data D0-D7 are transmitted simultaneously by the memory 101, the controller 105 can start to receive the data D0-D7 at a time T0. Therefore, compared to the conventional memory system, the present invention can save 4 clock latencies. In addition, operation method of writing the 8-bit data D0-D7 is similar to the above-mentioned operation methods, so further descriptions thereof are omitted for simplicity.

Please refer to FIG. 3 again. As shown in FIG. 3, the controller 105 is further coupled to the physical layer 103 through a plurality of control wires, the physical layer 103 further includes a plurality of second control pads SCP, the memory 101 further includes a plurality of first control pads FCP, and the plurality of first control pads FCP are electrically connected to the plurality of second control pads SCP. Therefore, the controller 105 can utilize the plurality of control wires, the plurality of second control pads SCP, and the plurality of first control pads FCP to transmit control signals CS to the memory 101. In addition, FIG. 3 only shows three first control pads, three second control pads, and three control wires, but the present invention is not limited thereto. In addition, the plurality of control wires and the plurality of wire pairs between the physical layer 103 and the controller 105 are included in the DFI bus, wherein the DFI bus defines signals, timing parameters, and programmable parameters required for communications between the physical layer 103 and the controller 105. Therefore, the control signals CS are defined by the DFI bus and can include, for example, write enable signal, read enable signal, and chip select signal. In addition, an operation method corresponding to the DFI bus is well-known to those of ordinary skill in the art, so further description thereof is omitted for simplicity. In addition, the logic circuit 102 in another embodiment may further includes system circuits (not shown in FIG. 3), wherein the system circuits can include other peripheral interfaces. The controller or memory controller 105 communicates with the system circuits through an Advanced extensible Interface (AXI) bus. For example, the controller 105 can transmit the N-bit data RD to the system circuits or receive the N-bit data WD from the system circuits through the AXI bus to other devices or processors.

In addition, the plurality of first pads FP can be electrically connected to the plurality of second pads SP by metal wires, metal bridges, flip-chip, micro-bump, or other bonding technologies. In addition, in another embodiment of the present invention, because the plurality of first pads FP are electrically connected to the plurality of second pads SP, the plurality of first pads FP and the plurality of second pads SP are not coupled to environment outside the memory system 100. Therefore, the plurality of first pads FP and the plurality of second pads SP do not need to include conventional electrostatic discharge (ESD) protection circuits, and sizes of the plurality of first pads FP and the plurality of second pads SP can be reduced.

In another embodiment of the present invention, the second align circuit 1031 of the physical layer 103 can be applied to different data width which is depending on a data width of the AXI bus. However, in another embodiment of the present invention, both the second align circuit 1031 of the physical layer 103 and the first align circuit 1011 of the memory 101 can be applied simultaneously to different data width which depends on the data width of the AXI bus. For example, when the logic circuit 102 is applied to a memory with Q-bit data width, the controller 105 can inform the physical layer 103 to adjust the second align circuit 1031 to make the second align circuit 1031 only utilize Q reading wires of the plurality of wire pairs to transmit Q-bit data to the controller 105 (or utilize Q writing wires of the plurality of wire pairs to receive Q-bit data from the controller 105), wherein Q is a positive integer greater than 1 and less than N. Therefore, the physical layer 103 and the controller 105 can be applied to different system circuits and different memories with the different data width.

Figure 6:
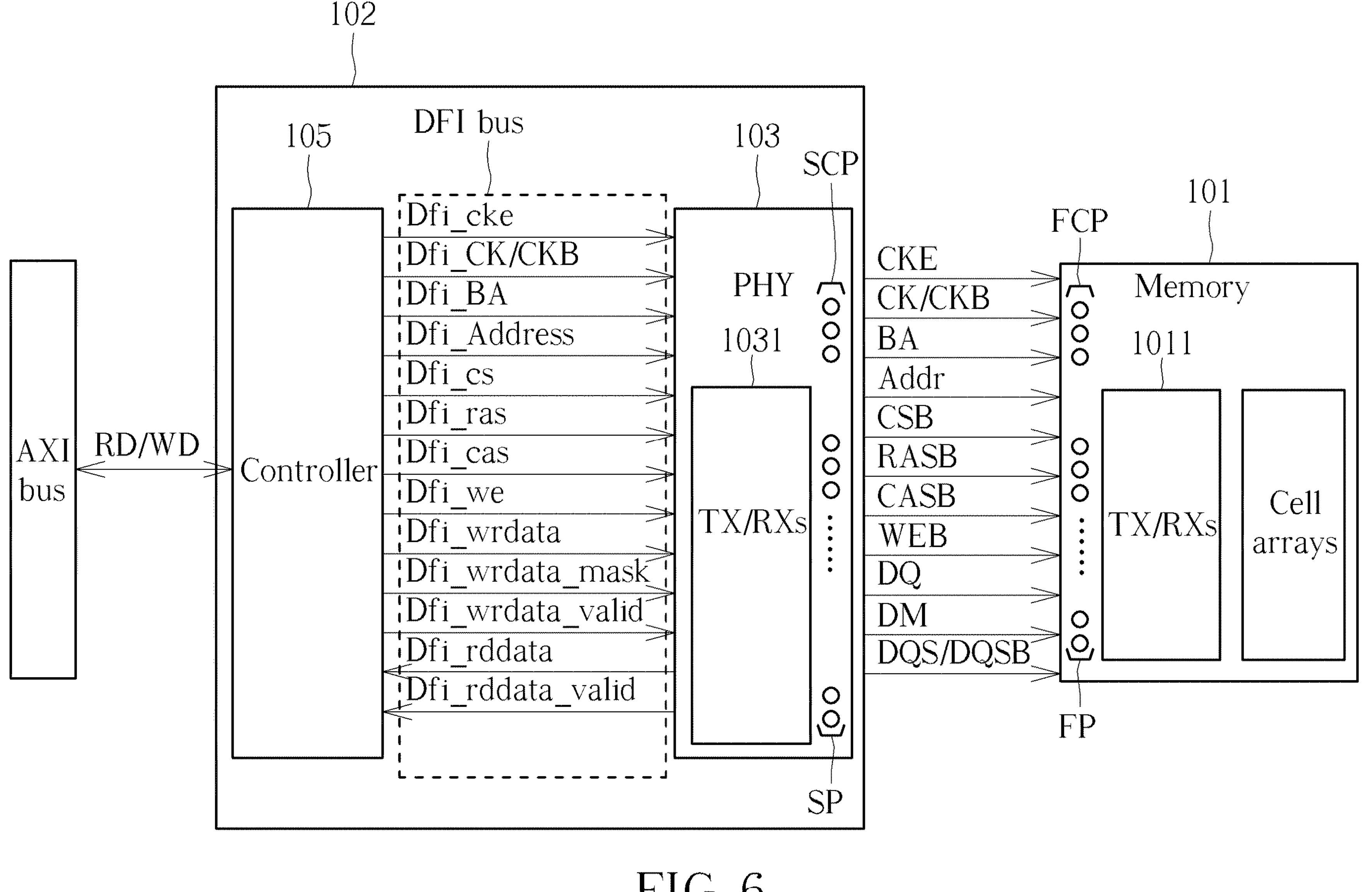
FIG. 6 is a diagram illustrating an area of the memory being less than an area of the conventional memory and an area of the physical layer is also is less than an area of a physical layer in the conventional logic circuit.

Because the first align circuit 1011 and the second align circuit 1031 are smaller and simpler, and the conventional parallel-to-serial and serial-to-parallel circuits are omitted from the memory 101 and the physical layer 103, reading/writing speed of the memory 101 are significantly increased, an area of the memory 101 is less than an area of the conventional memory and an area of the physical layer 103 is also is less than an area of a physical layer in the conventional logic circuit (as shown in FIG. 6), and a memory-wall problem between the memory 101 and the logic circuit 102 can be reduced. In addition, the physical layer 103 can receive signals of Dfi cke, Dfi CK/CKB, Dfi BA, Dfi address, Dfi cs, Dfi_ras, Dfi cas, Dfi we, Dfi wrdata, Dfi wrdata mask, Dfi wrdata valid from the controller 105 and transmit signals of Dfi rddata, Dfi rddata valid to the controller 105 through the DFI bus, wherein the signals of Dfi cke, Dfi CK/CKB, Dfi BA, Dfi address, Dfi cs, Dfi_ras, Dfi cas, Dfi we, Dfi wrdata, Dfi wrdata mask, Dfi wrdata valid and the signals of Dfi rddata, Dfi rddata valid are well-defined in DFI specification, so further descriptions thereof are omitted for simplicity. In addition, the physical layer 103 can transmit signals of CKE, CK/CKB, BA, Addr, CSB, RASB, CASB, WEB, DQ, DM, DQS/DQSB to the memory 101, wherein the signals of CKE, CK/CKB, BA, Addr, CSB, RASB, CASB, WEB, DQ, DM, DQS/DQSB are also well-defined in DFI specification, so further descriptions thereof are omitted for simplicity. Therefore, the plurality of first pads FP can be electrically connected to the plurality of second pads SP even if the memory 101 and the logic circuit 102 are made by heterogeneous processes. For example, transistors of the memory 101 can be planar or trench transistors adopted by current memory technologies (e.g. DRAM or HBM technologies) while transistors of the logic circuits 102 can be 3D transistors (e.g. tri-gate transistors, fin field-effect transistors (FinFETs), or gate-all-around transistors). However, in another embodiment of the present invention, the memory 101 and the logic circuit 102 are made by homogeneous processes. That is, the memory 101 and the logic circuit 102 can adopt the planar or trench transistors, the tri-gate transistors, the FinFETs, gate-all-around transistors, or other transistors. Moreover, powers of the memory 101 and the logic circuits 102 are saved, latencies of accessing the memory 101 are reduced, and cost of areas of the memory 101 and the logic circuits 102 are decreased by adopting the first align circuit 1011 and the second align circuit 1031, rather than adopting the conventional parallel-to-serial and serial-to-parallel circuits. Therefore, reading/writing window margins of the memory system 100 are improved.

Figure 7:
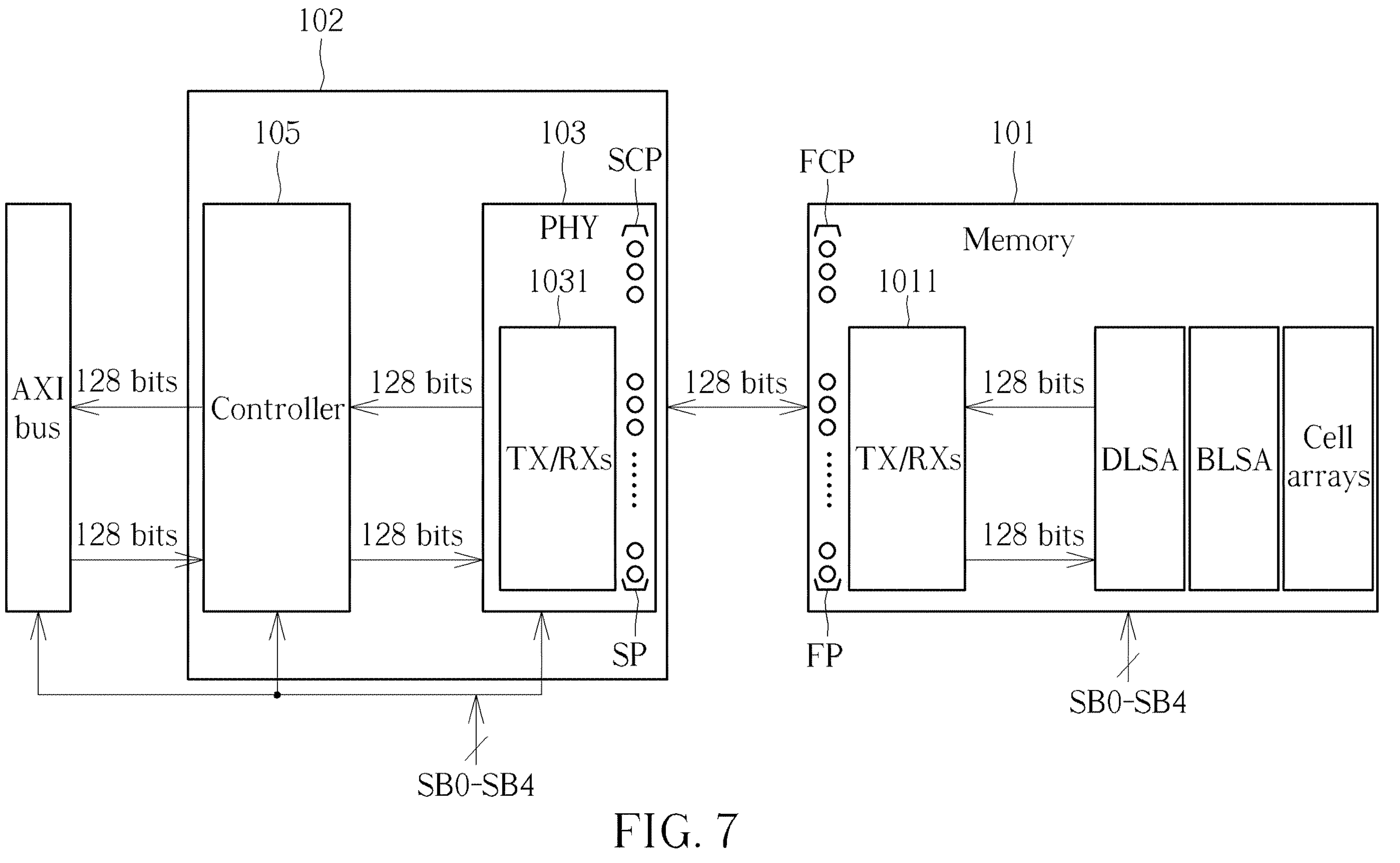
FIG. 7 is a diagram illustrating a data width of the memory being changed by control signals according to another embodiment of the present invention.

In addition, please refer to FIG. 7. FIG. 7 is a diagram illustrating a data width of the memory being changed by control signals according to another embodiment of the present invention. For example (but not limited), the memory 101 includes M second sensing amplifiers BLSA (i.e. bit line sensing amplifiers) and N first sensing amplifiers DLSA (i.e. data line sensing amplifiers), wherein a connected number of the M second sensing amplifiers BLSA electrically coupled to the first sensing amplifiers DLSA can be changed by control signals (such as 0SB0-SB4 according to TABLE 1), the second sensing amplifiers BLSA are between the cell arrays and the first sensing amplifiers DLSA, the first sensing amplifiers are between the second sensing amplifiers BLSA and the first align circuit 1011 which includes the plurality of transceivers, the first align circuit 1011 is between the first sensing amplifiers DLSA and an I/O data bus (not shown in FIG. 7) of the memory 101, N is a positive integer and not greater than M, and the I/O data bus is coupled to the plurality of first pads FP.

In one embodiment, the control signals are stored in a register (not shown in FIG. 7) of the memory 101, such as mode registers. In addition, the second sensing amplifiers are connected to bit lines (not shown in FIG. 7) of the memory 101, and the first sensing amplifiers are connected to data lines (not shown in FIG. 7) of the memory 101. The N first sensing amplifiers DLSA are electrically coupled to part of the M second sensing amplifiers BLSA through a plurality of bit switches, and those bit switches could be selected or activated by the aforesaid control signals.

As shown in TABLE 1 and FIG. 7, when the control signals SB0-SB4 are 0/0/0/0/1, 128 second sensing amplifiers are electrically coupled to 128 first sensing amplifiers through bit switches (not shown in FIG. 7, a group of selected bit switches, such as 128 or less bit switches based on ONE given column address, are selected by the control signals SB0-SB4 (0/0/0/0/1)), so 128 bits data can be read from the cell arrays of the memory 101 through part of the second sensing amplifiers and the first sensing amplifiers (such as through the 128 connected second sensing amplifiers and the 128 first sensing amplifiers), or written into the cell arrays of the memory 101 by the first align circuit 1011 through part of the second sensing amplifiers and the first sensing amplifiers (such as through the 128 connected second sensing amplifiers and the 128 first sensing amplifiers). That is, when the 128 bits data are read from the cell arrays of the memory 101, the plurality of transceivers of the first align circuit 1011 parallelly receive and transmit the 128 bits data from the 128 first sensing amplifiers to the I/O data bus of the memory 101, or when the 128 bits data are written into the cell arrays of the memory 101, the plurality of transceivers of the first align circuit 1011 parallelly receive and transmit the 128 bits data from the I/O data bus to the 128 first sensing amplifiers. Or in other words, when the 128 bits data are read from the cell arrays of the memory 101, part of the second sensing amplifiers BLSA (such as the 128 connected second sensing amplifiers) output the 128 bits data to the first sensing amplifiers DLSA (such as the 128 first sensing amplifiers) which then parallelly output the 128 bits data to the plurality of transceivers, or when the 128 bits data are written into the cell arrays of the memory 101, the 128 first sensing amplifiers parallelly output the 128 bits data to part of the connected second plurality of sensing amplifiers (such as the 128 first sensing amplifiers BLSA). In addition, a data width of the memory 101 (i.e. a width of the I/O data bus of the memory 101) is equal to 128 according to the 128 first sensing amplifiers. Meanwhile, because the data width of the memory 101 is equal to 128, both a data width of the controller 105 and the data width of the AXI bus are equal to 128.

In another embodiment of the present invention, a read (or write) data width of the DFI bus coupled to physical layer 103 are also equal or set to 128 according to the control signals SB0-SB4. In addition, as shown in FIG. 7, when the logic circuit 102 is included in a computing system with a system bus interface (i.e. the AXI bus) which includes a read data bus and a write data bus, both a width of the read data bus and a width of the write data bus are equal to 128 according to the control signals SB0-SB4 (0/0/0/0/1) inputted to the controller 105. In addition, a width of the DFI bus is selectively adjusted according to the control signals SB0-SB4 (0/0/0/0/1) inputted to the physical layer 103.

Similarly, as shown in TABLE 1 and FIG. 7, when the control signals SB0-SB4 are 0/0/0/1/0, 256 second sensing amplifiers of the M second sensing amplifiers are electrically coupled to 256 first sensing amplifiers through another group of selected bit switches (such as 256 or less bit switches based on ONE given column address), so the data width of the memory 101 is limited to be equal to 256 according to the 256 first sensing amplifiers; when the control signals SB0-SB4 are 0/0/0/1/1, 512 second sensing amplifiers of the M sensing amplifiers are electrically coupled to 512 first sensing amplifiers through other selected bit switches (such as 512 or less bit switches based on ONE given column address), so the data width of the memory 101 is limited to be equal to 512 according to the 512 first sensing amplifiers; when the control signals SB0-SB4 are 0/0/1/0/0, 1024 second sensing amplifiers of the M second sensing amplifiers are electrically coupled to 1024 first sensing amplifiers through other selected bit switches (such as 1024 or less bit switches based on ONE given column address), so the data width of the memory 101 is limited to be equal to 1024 according to the 1024 first sensing amplifiers; and when the control signals SB0-SB4 are 0/0/0/0/0, 64 second sensing amplifiers of the M second sensing amplifiers are electrically coupled to 64 first sensing amplifiers through selected bit switches (such as 64 or less bit switches based on ONE given column address), so the data width of the memory 101 is limited to be equal to 64 according to the 64 first sensing amplifiers. In addition, the present invention is not limited to the memory 101 including the M second sensing amplifiers and configurations of the control signals SB0-SB4 shown in FIG. 7. In addition, the present invention is also not limited to a number of the control signals SB0-SB4, that is, the present invention can have a number of control signals less than or more than the number of the control signals SB0-SB4.

TABLE 1

| SB4/SB3/SB2/SB1/SB0 | The data width of the memory 101 | The data width of the controller 105 | The data width of the AXI bus |
|---|---|---|---|
| 0/0/1/0/0 | 1024 | 1024 | 1024 |
| 0/0/0/1/1 | 512 | 512 | 512 |
| 0/0/0/1/0 | 256 | 256 | 256 |
| 0/0/0/0/1 | 128 | 128 | 128 |
| 0/0/0/0/0 | 64 | 64 | 64 |

Figure 8:
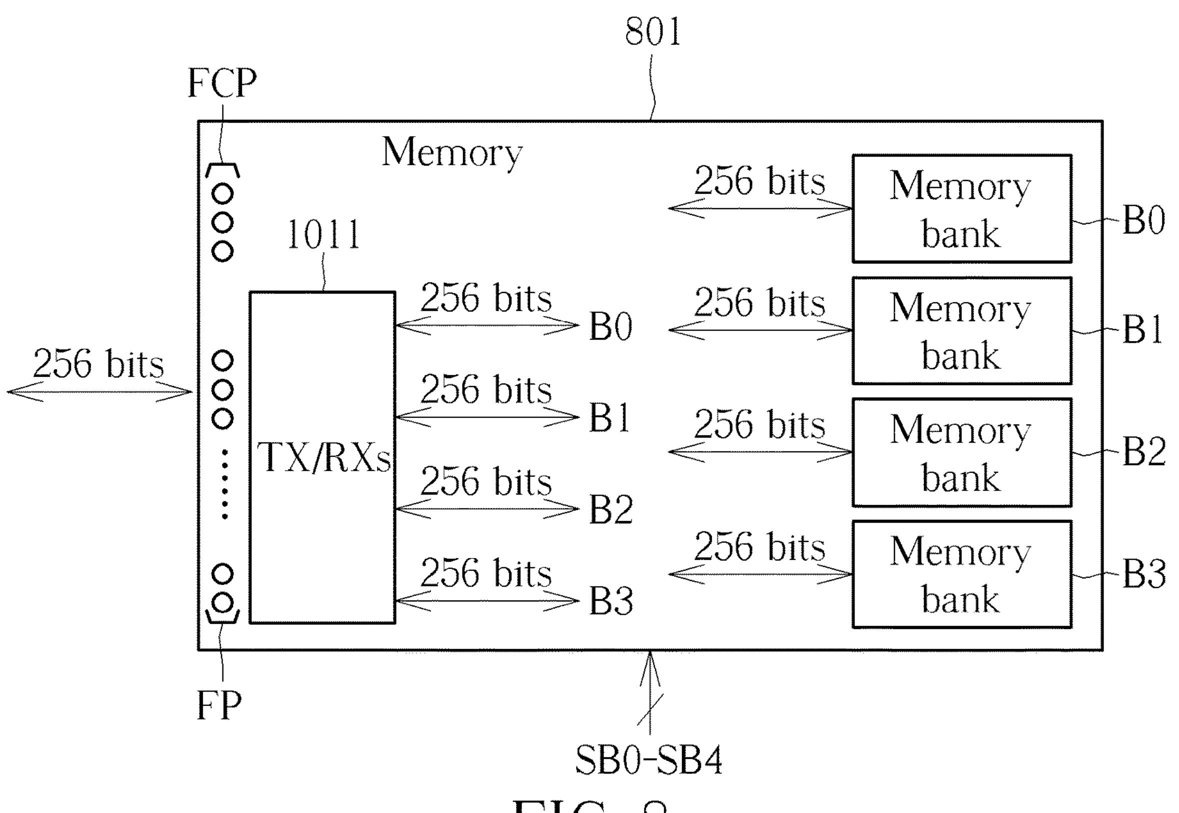
FIGS. 8, 9 are diagrams illustrating different memories according to different embodiments of the present invention.

In addition, please refer to FIG. 8. FIG. 8 is a diagram illustrating a memory 801 according to another embodiment of the present invention, wherein a difference between the memory 801 and the memory 101 is that the memory 801 includes 4 memory banks B0-B4, each memory bank of the memory banks B0-B4 is just the cell arrays of the memory 101. But, the present invention is not limited to the memory 801 including the 4 memory banks B0-B4 (that is, the memory 801 can include a plurality of memory banks). In addition, for simplicity, the M second sensing amplifiers BLSA and the N first sensing amplifiers DLSA are not shown in FIG. 8.

As shown in TABLE 2 and FIG. 8, when the control signals SB0-SB4 are 0/0/0/1/0, 256 second sensing amplifiers of a specific memory bank of the memory 801 could be electrically coupled to 256 first sensing amplifiers by the control signals SB0-SB4, so 256 bits data can be read from the specific memory bank of the memory 801 by the first align circuit 1011 through the 256 connected second sensing amplifiers and the 256 first sensing amplifiers, or written into the specific memory bank of the memory 801 by the first align circuit 1011 through the 256 connected second sensing amplifiers and the 256 first sensing amplifiers. The specific memory bank of the memory 801 could be selected by another signal, such as bank selected signals. That is, as shown in TABLE 2, a data width of the selected memory bank of the memory 801 could be adjusted to be equal to 256 according to the 256 first sensing amplifiers. In addition, because the 4 memory banks B0-B4 are independent of each other, a data width of the memory 801 (i.e. a width of the I/O data bus of the memory 801) is also equal to 256. In addition, in another embodiment both the data width of the controller 105 and the data width of the DFI bus are equal to 256 according to the control signals SB0-SB4 (0/0/0/1/0)

In addition, other data widths of the each memory bank of the memory 801 and other data widths of the memory 801 corresponding to the control signals SB0-SB4 (0/0/1/0/0), (0/0/0/1/1), (0/0/0/0/1), (0/0/0/0/0) can be referred to TABLE 2, so further descriptions thereof are omitted for simplicity. In addition, the present invention is not limited to configurations of the control signals SB0-SB4 shown in FIG. 8.

TABLE 2

| SB4/SB3/SB2/SB1/SB0 | The data width of the AXI bus | The data width of the each memory bank | The data width of the memory 801 |
|---|---|---|---|
| 0/0/1/0/0 | 1024 | 1024 | 1024 |
| 0/0/0/1/1 | 512 | 512 | 512 |
| 0/0/0/1/0 | 256 | 256 | 256 |
| 0/0/0/0/1 | 128 | 128 | 128 |
| 0/0/0/0/0 | 64 | 64 | 64 |

Figure 9:
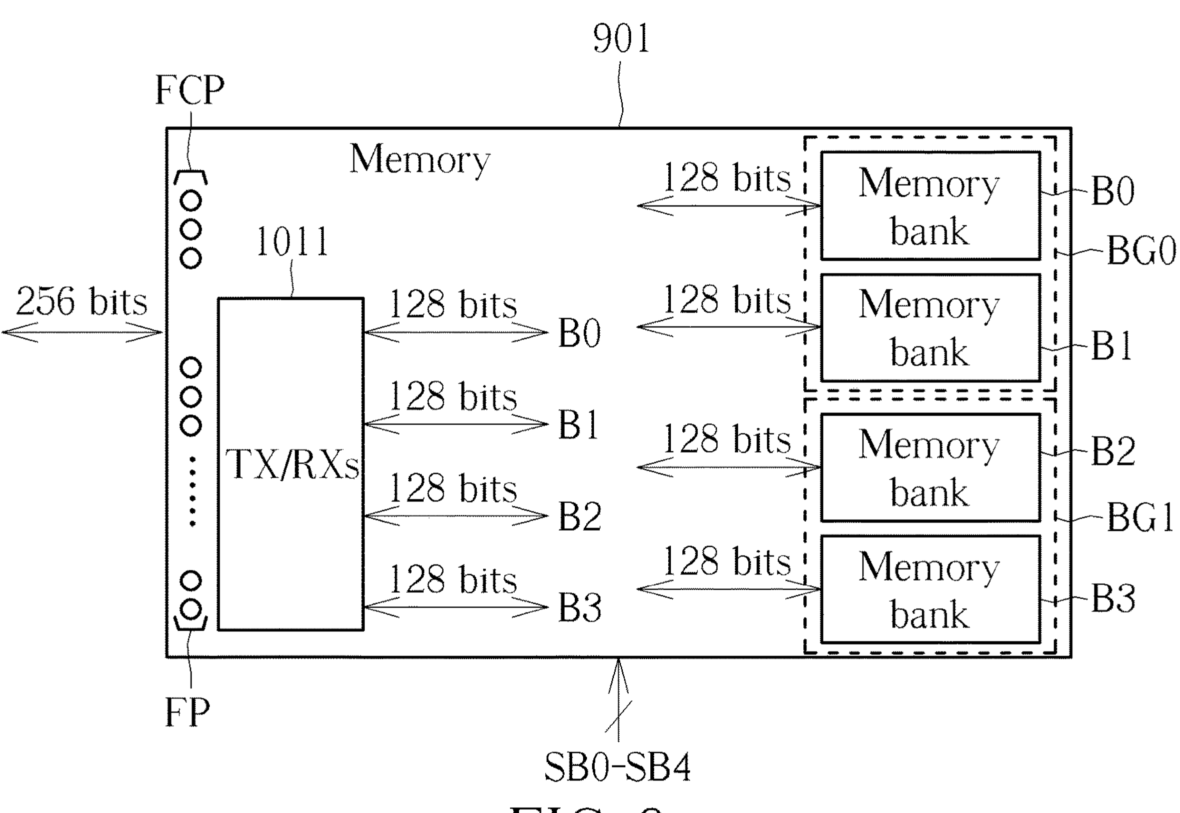

In addition, please refer to FIG. 9. FIG. 9 is a diagram illustrating a memory 901 according to another embodiment of the present invention, wherein a difference between the memory 901 and the memory 801 is that the memory banks B0, B1 are included in a bank group BG0, and the memory banks B2, B3 are included in a bank group BG1. But, the present invention is not limited to the bank group BG0 including the memory banks B0, B1, and the bank group BG1 including the memory banks B2, B3. For example, all banks B0, B1, B2, B3 could be grouped as a bank group BGX.

Taking the bank group BG0 as an example, a first set of sensing amplifiers coupled to the data lines and a second set of sensing amplifiers coupled to the data lines, wherein the first set of sensing amplifiers corresponds to the memory bank B0 and is configured to parallelly output a first plurality of data, the second set of sensing amplifiers corresponds to the memory bank B1 and configured to parallelly output a second plurality of data, and the first set of sensing amplifiers and the second set of sensing amplifiers are just the previously mentioned first sensing amplifiers (that is, DLSA). In addition, a third set of sensing amplifiers is coupled to the bit lines and configured between the memory bank B0 and the first set of sensing amplifiers, and a fourth set of sensing amplifiers coupled to the bit lines and configured between the memory bank B1 and the second set of sensing amplifiers, wherein the third set of sensing amplifiers and the fourth set of sensing amplifiers are just the previously mentioned second sensing amplifiers (that is, BLSA).

Therefore, as shown in TABLE 3 and FIG. 9, when the control signals SB0-SB4 are 0/1/0/1/0, 128 second sensing amplifiers corresponding to each memory bank of a specific bank group (e.g. the bank group BG0) are electrically coupled to 128 first sensing amplifiers corresponding to the each memory bank of the specific bank group by the control signals SB0-SB4, so 256 bits data can be read from the specific bank group by the first align circuit 1011 through 256 connected second sensing amplifiers and 256 first sensing amplifiers (because the first align circuit 1011 can read 128 bits data of the 256 bits data from one memory bank of the specific bank group through 128 connected second sensing amplifiers and 128 first sensing amplifiers corresponding to the one memory bank, and read other 128 bits data of the 256 bits data from another memory bank of the specific bank group through other 128 connected second sensing amplifiers and other 128 first sensing amplifiers corresponding to the another memory bank), or the 256 bits data can be written into the specific bank group by the first align circuit 1011 through the 256 connected second sensing amplifiers and the 256 first sensing amplifiers (because the first align circuit 1011 can write the 128 bits data of the 256 bits data to the one memory bank of the specific bank group through the 128 connected second sensing amplifiers and the 128 first sensing amplifiers corresponding to the one memory bank, and write the other 128 bits data of the 256 bits data to the another memory bank of the specific bank group through the other 128 connected second sensing amplifiers and the other 128 first sensing amplifiers corresponding to the another memory bank). That is, as shown in TABLE 3, a data width of each memory bank of the specific bank group are limited to be equal to 128 according to the 128 first sensing amplifiers. In addition, because the memory banks B0, B1 are included in the bank group BG0, a data width of the memory 901 (i.e. a width of the I/O data bus of the memory 901) is equal to a sum (i.e. 128+128=256) of data width of all memory banks of the specific bank group. And the available banks will be reduced to half, as compared to FIG. 8.

In addition, other data widths of the each memory bank of the memory 901 and other data widths of the memory 901 corresponding to the control signals SB0, SB1 (0/1/0/0/0), (0/1/0/0/1), (0/1/0/1/1), (0/0/0/0/0) can be referred to TABLE 3, so further descriptions thereof are omitted for simplicity. In addition, the present invention is not limited to configurations of the control signals SB0-SB4 shown in FIG. 9.

TABLE 3

| SB4/SB3/SB2/SB1/SB0 | The data width of the AXI bus | The data width of the memory 801 | The data width of the each memory bank |
|---|---|---|---|
| 0/1/0/0/0 | 1024 | 1024 | 512 |
| 0/1/0/0/1 | 512 | 512 | 256 |
| 0/1/0/1/0 | 256 | 256 | 128 |
| 0/1/0/1/1 | 128 | 128 | 64 |
| 0/0/0/0/0 | 64 | 64 | 32 |

To sum up, the memory system provided by the present invention includes the memory and the logic circuit. The memory includes the plurality of first pads and the first align circuit for transmitting to or receiving from a memory I/O data bus regarding a group data in parallel. The DLSAs of the memory could be directly connected to the first align circuit and the serial-to-parallel/serial-to-parallel converting circuit in traditional memory is omitted. Thus, the width of the memory I/O data bus is wider. Furthermore, the logic circuit includes the controller and the physical layer, wherein the physical layer includes the plurality of second pads and the second align circuit also for transmitting the group data in parallel or receiving the group data in parallel. Similarly, the serial-to-parallel/serial-to-parallel converting circuit in traditional physical layer is also omitted. The controller transmits to or receives from a system bus (such as AXI bus) the group data in parallel. Moreover, the width of the memory I/O data bus is equal to the read data bus (or write data bus) of the AXI bus. Therefore, such memory is a Direct interface Wide Bus (DWB) memory or RAM. Compared to the prior art, powers, accessing latencies, and area costs of the DWB RMA/memory system can be reduced, and the reading/writing window margins of the memory system can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory chip comprising:

a first align circuit comprising a plurality of transceivers;

a first set of memory banks;

data lines;

a plurality set of data line sensing amplifiers coupled to the data lines, wherein each set of data line sensing amplifiers is corresponding to one memory bank of the first set of memory banks and each set of data line sensing amplifiers are electrically connected to the plurality of transceivers through the data lines; and an I/O data bus of the memory chip electrically coupled to the first set of memory banks, wherein during a read operation of the memory chip, each memory bank transmits a first predetermined width of data to the plurality of transceivers which simultaneously transmit the first predetermined width of data of each memory bank in parallel to the I/O data bus, and during a write operation of the memory chip, the I/O data bus are configured to output a second predetermined width of data to the plurality of transceivers which then simultaneously transmit a corresponding portion of the second predetermined width of data in parallel to each memory bank of the first set of memory banks, wherein a predetermined data width of the I/O data bus is equal to a sum of the first predetermined width of data outputted by each memory bank of the first set of the memory banks during the read operation of the memory chip, and the predetermined data width of the I/O data bus is equal to a sum of the corresponding portion of the second predetermined width of data received by each memory bank of the first set of the memory banks during the write operation of the memory chip;

wherein there is no parallel-to-serial circuit and serial-to-parallel circuit in the memory chip.

2. The memory chip of claim 1, further comprising a second set of memory banks, wherein each memory bank of the second set of memory banks transmits a second predetermined width of data to the I/O data bus in parallel, the width of the I/O data bus is selectively equal to, based on a selection signal, the sum of the first predetermined width of data of each memory bank of the first set of the memory banks or a sum of the second predetermined width of data of each memory bank of the second set of the memory banks.

3. The memory chip of claim 2, wherein when the width of the I/O data bus is equal to the sum of the second predetermined width of data of each memory bank of the second set of the memory banks, the second predetermined width is programmable according to the set of control signals.

* * * * *